(12) United States Patent
Dartois

(10) Patent No.: US 7,466,966 B2
(45) Date of Patent: Dec. 16, 2008

(54) METHOD FOR CLIPPING A WIDEBAND RADIO SIGNAL AND CORRESPONDING TRANSMITTER

(75) Inventor: Luc Dartois, Carrieres sous Poissy (FR)

(73) Assignee: Alcatel, Paris (FR)

( * ) Notice: Subject to any disclaimer, the term of this patent is extended or adjusted under 35 U.S.C. 154(b) by 1523 days.

(21) Appl. No.: 09/970,694

(22) Filed: Oct. 5, 2001

(65) Prior Publication Data

US 2002/0042253 A1 Apr. 11, 2002

(30) Foreign Application Priority Data

Oct. 6, 2000 (EP) ................... 00440268
Oct. 13, 2000 (EP) ................... 00440273

(51) Int. Cl.
*H04B 17/00* (2006.01)
*H04Q 7/20* (2006.01)
*H04B 1/04* (2006.01)

(52) U.S. Cl. .................. 455/127.1; 455/423; 455/67.11

(58) Field of Classification Search ... 455/127.1–127.2, 455/423–425, 67.11, 67.13, 226.2, 226.3
See application file for complete search history.

(56) References Cited

U.S. PATENT DOCUMENTS

| 3,675,138 A | | 7/1972 | Standing |
| 4,272,846 A | | 6/1981 | Muratani et al. |
| 4,890,297 A | * | 12/1989 | Zscheile et al. ............. 375/130 |
| 5,126,687 A | | 6/1992 | Onoda et al. |
| 5,631,969 A | * | 5/1997 | Hanson ...................... 381/107 |
| 6,256,157 B1 | * | 7/2001 | Biskeborn et al. ............. 360/31 |
| 6,337,999 B1 | * | 1/2002 | Orban ........................ 700/94 |

FOREIGN PATENT DOCUMENTS

EP 0 940 911 A1 9/1999

\* cited by examiner

*Primary Examiner*—Duc Nguyen
*Assistant Examiner*—Michael T Thier
(74) *Attorney, Agent, or Firm*—Sughrue Mion, PLLC

(57) ABSTRACT

A method for clipping a wideband signal in order to eliminate signal overshots having an amplitude above a predefined threshold before submitting the wideband signal to a power amplifier. The method subtracts, from the wideband signal, filtered pulses in phase with the wideband signal, each filtered pulse corresponding to an overshot, and the amplitude of each filtered pulse being dependant on the amplitude of the corresponding overshot and on the predefined threshold. The subtraction step is repeated at least twice on the wideband signal.

13 Claims, 4 Drawing Sheets

METHOD FOR CLIPPING A WIDEBAND RADIO SIGNAL AND CORRESPONDING TRANSMITTER

BACKGROUND OF THE INVENTION

The present invention relates to wideband signal transmission over a radio interface.

Usually, the transmit chain of a radio communication network comprises a power amplifier to amplify a signal before transmission over the radio interface.

On the one hand, the peak to average ratio (PAR) is an important characteristic of the signal submitted to the power amplifier. The peak to average ratio is defined by the ratio between the highest amplitude of the signal and the average amplitude of the signal. Wideband signals superposing information transmitted by several users using spread spectrum techniques (e.g. CDMA signals) are presenting a near-Gaussian frequency distribution with a stringent spectrum mask and wide envelope modulation dynamic resulting in high peak to average ratio (PAR about 10 dB).

On the other hand, a power amplifier is usually characterized by its efficiency defined as the ratio between the power of the signal at the amplifier output and the total power consumption of the power amplifier.

A signal having a high peak to average ratio results in a low efficiency of the power amplifier. For a standard compliant amplification of a CDMA signal with a PAR about 10 dB, an over-dimensioning of the amplifier chain of the same order is required (known as power amplifier backoff of about 10 dB). Such an over-dimensioning causes big penalties in terms of required energy supply or appropriate cooling means at the transmitters of the radio communication network (especially at the base stations). This over-dimensioning is nevertheless necessary not to reach the non-linear domain of the power amplifier characteristics. If this happens, peaks in the signal (called in the following overshots) would saturate the power amplifier causing high error rate at the receiver due to modulation distortion.

A known countermeasure to this problem is the clipping technique. It consists of eliminating, from the signal, the overshots having an amplitude above a threshold amplitude determined according to the characteristics of the power amplifier. This is usually obtained by saturating the signal at this amplitude threshold. The choice of the threshold value is a tradeoff between the power amplifier efficiency, the quality of the transmitted signal and the receiver sensitivity. Indeed, the lower the threshold is set, the more information contained in the overshots will be removed from the signal and the more efficient the receiver will have to be to recover information that have been eliminated because of clipping.

The usual clipping techniques have to face non-linear filtering problems. On the one hand, saturating the signal at the threshold value generates wide band noise which is not compatible with requirements set to the signal in term of spectrum mask. Indeed, the usual clipping techniques cause the signal spectrum to extend beyond the allowed spectrum mask, causing interference in adjacent frequency channels. On the other hand, when filtering is performed to eliminate the noise outside the allowed spectrum mask, the memory effect intrinsic to filtering regenerates signal overshots above the desired threshold value.

These drawbacks are even harder to cope with when the power amplifier is shared between several adjacent wideband carriers to optimize cost and size of the transmitter. In this case, the signal provided to the amplifier is the sum of several frequency multiplexed signals, which tend to have a Raleigh frequency distribution again even if each individual signal has been clipped by the usual known method. A Raleigh frequency distribution shows the same drawbacks in term of overshots as a Gaussian distribution.

Moreover, an acceptable power amplifier efficiency is only provided at the price of tremendous processing efforts not compatible with usual computing capabilities.

An aspect of the present invention is to provide a clipping method that fulfills the requirements in terms of frequency spectrum range of the clipped signal with a reasonable processing effort.

Another aspect of the present invention is to provide a transmitter implementing this method.

SUMMARY OF THE INVENTION

These aspects, and others that appear below, are achieved by a method for clipping a wideband signal in order to eliminate signal overshots having an amplitude above a predefined threshold before submitting the wideband signal to a power amplifier. The method comprising the steps of subtracting from the wideband signal filtered pulses in phase with the wideband signal, each of the filtered pulses corresponding to one of the overshots, the amplitude of each filtered pulses being dependent on the amplitude of the corresponding overshot and on the predefined threshold, and repeating at least two successive iterations of the subtracting step on the wideband signal.

These aspects are further achieved by a transmitter for transmit a wideband signal on a radio interface, said transmitter comprising a signal synthesis module, a clipping module to eliminate signal overshots above a predefined threshold, and a power amplifier, said clipping module comprising:
  a pulse generator for generating filtered pulses in phase with said wideband signal, each of said filtered pulses corresponding to one of said overshots, the amplitude of each of said filtered pulses being dependent on the amplitude of said corresponding overshot;
  a subtractor for subtracting said filtered pulses from said wideband signal; and
  a loop for repeating at least twice the processing of said wideband signal by said clipping module.

The method according to the invention has the advantage of providing an efficient clipping method especially when the power amplifier is shared between several adjacent wideband carriers. Successive iterations of the clipping method are applied to the signal in order to progressively suppress the signal overshots from the biggest to the lowest ones. This presents the advantage of further reducing the processing power necessary for properly clipping the signal and minimizing the distortion of the useful signal.

Another advantage of this method is to optimize the frequency spectrum purity for the clipped signal. As a consequence, it increases the system capacity since the adjacent channel interference is reduced.

Another advantage of this method is to increase the output power or the number of simultaneous users for the same power dissipation at the power amplifier as compared with a clipping method as known in the art. From another point of view, the cost of each transmitted Watt is reduced since a higher power amplifier efficiency is attained than with a clipping method as known in the art.

In another preferred embodiment, the signal to be clipped is oversampled with a predefined high oversampling factor so as to track more precisely the signal overshots.

Further advantageous features of the invention are defined in the dependent claims.

This invention is based on a priority application EP 00 44 0268 which is hereby incorporated by reference.

BRIEF DESCRIPTION OF THE DRAWINGS

Other characteristics and advantages of the invention will appear on reading the following description of a preferred implementation given by way of non-limiting illustrations, and from the accompanying drawings, in which.

DETAILED DESCRIPTION OF THE INVENTION

According to the invention, the proposed clipping module eliminates signal overshots above a predefined threshold in that it generates filtered pulses in phase with the signal to be clipped, each filtered pulse corresponding to an overshot, the amplitude of each filtered pulse being dependent on the amplitude of said corresponding overshot.

Figure 1:
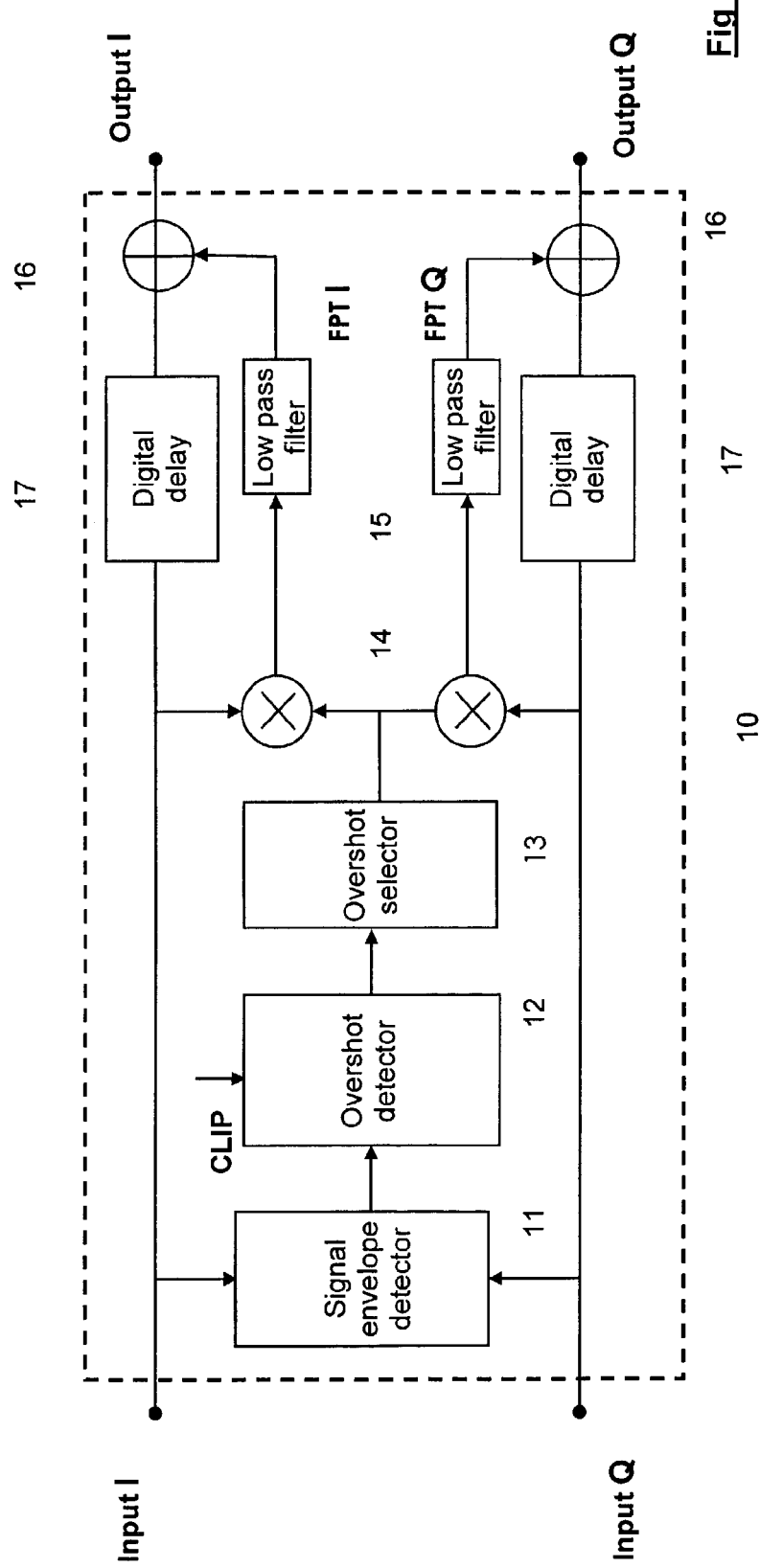
FIG. 1 shows an embodiment of a clipping module according to the present invention.

FIG. 1 shows an embodiment of a clipping module according to the present invention. Clipping module 10 comprises a signal envelope detector 11, an overshot detector 12, an overshot selector 13, a pulse train generator 14, a low pass filter 15, and a subtractor 16. The clipping module receives as input a baseband signal comprising an in-phase part, Input I, and an in-quadrature part, Input Q. Preferably, the base band signal is represented in digital form so that clipping module 10 performs digital processing.

The in-phase, Input I, and in-quadrature, Input Q, parts of the signal are connected to the signal envelope detector 11, which determines the envelope of the signal (i.e. by determining the module of the vector having the in-phase value as real part and the in-quadrature value as complex part in the complex space).

The signal envelope is submitted to the overshot detector 12, which compares the amplitude of the signal envelope with a predefined threshold value CLIP. The overshot detector 12 determines the different overshots amplitudes and positions. Preferably, the overshot detector 12 normalizes the amplitude of the overshots according to a predefined function. This function consists in the difference between the overshot amplitude and the threshold value CLIP divided by the overshot amplitude.

The peak selector 13 selects the overshots that should be taken into account for further processing. A possible selection criterion is the number N of overshots to be kept for further processing in a time window of predefined duration. The highest N overshots in the time window are then selected. Another selection criterion is the distance between two consecutive overshots. This distance should be higher than a predefined distance. Other overshot selection criterion may be envisaged.

Information on the selected overshot amplitude and position in the time window is submitted to the pulse train generator 14 which generates a pulse train in phase with the input signal Input I, Input Q. Preferably, the amplitude of the pulse train is equal to zero when no corresponding overshot has been selected and to the difference between the overshot amplitude and the threshold value when an overshot has been selected by overshot selector 13.

The pulse train generator 14 detects the phase $\phi$ of the base band signal Input I, Input Q and generates a pulse train having the same phase $\phi$. For illustration purposes, the pulse train comprises two parts, the in-phase part, FPT I, obtained by multiplying each sample given by the overshot selector 13 by the real part of the input signal, Input I, and the in-quadrature part, FPT Q, obtained by multiplying each sample given by the overshot detector 13 by the complex part of the input signal, Input Q.

The two parts of the pulse train are then filtered by a low pass filter 15. Preferably, the low pass filter is a Root Raised Cosine (RRC) digital filter characterized by its length. The coefficients of the RRC filters are preferably stored in a memory not represented on FIG. 1. As known by those skilled in the art, the coefficients of the RRC filter may be chosen in different ways without narrowing the scope of the present invention. An analysis of the statistics of the overshots in a CDMA signal permits an optimization in the filter implementation.

The in-phase part, FPT I, of the filtered pulse train, and its in-quadrature part FPT Q, are subtracted from the in-phase part, Input I, of the input signal, and from its in-quadrature part, Input Q, respectively at the subtractor 16. Preferably, the two parts of input signal, Input I, Input Q, are submitted to a digital delay 17 before being used at the subtractor 16 in order to take into account the processing time needed to generate the filtered pulse train FPT I, FPT Q as well as the intrinsic filter group delay. The output of the subtractor 16 represents the clipped signal output I, output Q.

Contrary to usual known clipping methods consisting in saturating the overshots at the threshold value, the method according to the invention consists in subtracting from the input signal filtered pulses pre-tuned in phase and amplitude which mimic as exactly as possible the selected overshot to remove. The method according to the invention respects the spectrum mask of the input signal much better than usual clipping methods.

A preferred embodiment of the present invention consists in cascading several clipping stages 10 in order to progressively perform clipping, thus reducing the complexity of the clipping module.

Figure 2:
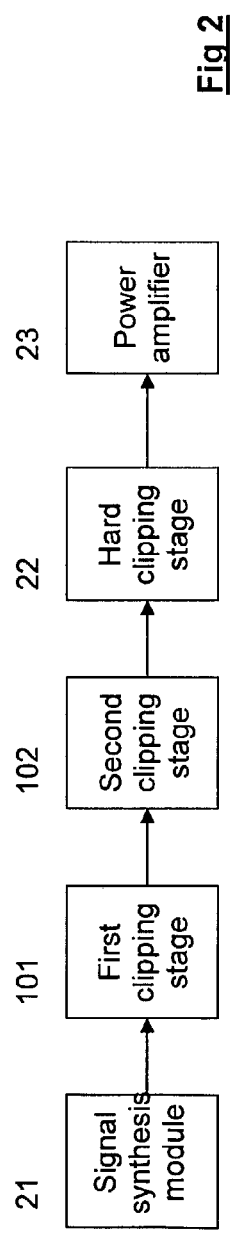
FIG. 2 shows an embodiment of a transmitter according to the present invention.

FIG. 2 shows an embodiment of a transmitter according to the present invention in which several clipping stages are cascaded. Transmitter 20 comprises a signal synthesis module 21, a first clipping stage 101, a second clipping stage 102, a usual clipping module 22 and a power amplifier 23.

Signal synthesis module 21 constructs a digital signal flow corresponding to the information to be transmitted. Error correcting code, modulation, superposition of multiple users, as well as other usual signal processing well known from those skilled in the art, are performed in digital form in this module. The signal flow is preferably a CDMA carrier having a predefined chip rate and representing a superposition of several users using different orthogonal spreading sequences.

The signal flow may also be a superposition of at least two adjacent CDMA carriers. The latter example is especially accurate when the amplification chain is shared between adjacent CDMA carriers in one base station.

In a preferred embodiment of the invention, the signal synthesis module also comprises an oversampling module to oversample the digital signal flow at a higher rate than the chip rate of the signal (for example, oversampling rate=32*chip rate). This has the advantage to track more accurately the sudden variations of the signal amplitude in case of signal overshot.

The oversampled signal at the output of the signal synthesis module 21 is submitted to a first clipping stage 101 performing a first clipping iteration according to the present invention. The clipped signal is submitted to a second clipping stage 102 performing a second clipping iteration according to the invention. The first clipping step is dedicated to remove a first group of overshots (e.g. the N highest ones) while the second clipping step is dedicated to remove the remaining ones. It will be clear for those skilled in the art that the number of successive clipping stages is not limited to two. Any number of successive clipping stages may be cascaded without narrowing the scope of the invention.

In a preferred embodiment of the invention, the clipped signal at the output of the second clipping stage 102 is submitted to a hard clipping stage 22 to remove the remaining minor overshots before entering the power amplifier 23. The hard clipping stage 22 uses a usual clipping method known in the art consisting for example in saturating the signal at the output of the second clipping stage 102 at the threshold value clip. Since most of the overshots have already been eliminated by subtraction of a filtered pulse train in both clipping stages 101 and 102, the difference between the amplitude of the remaining overshots and the threshold value is small.

Figure 3:
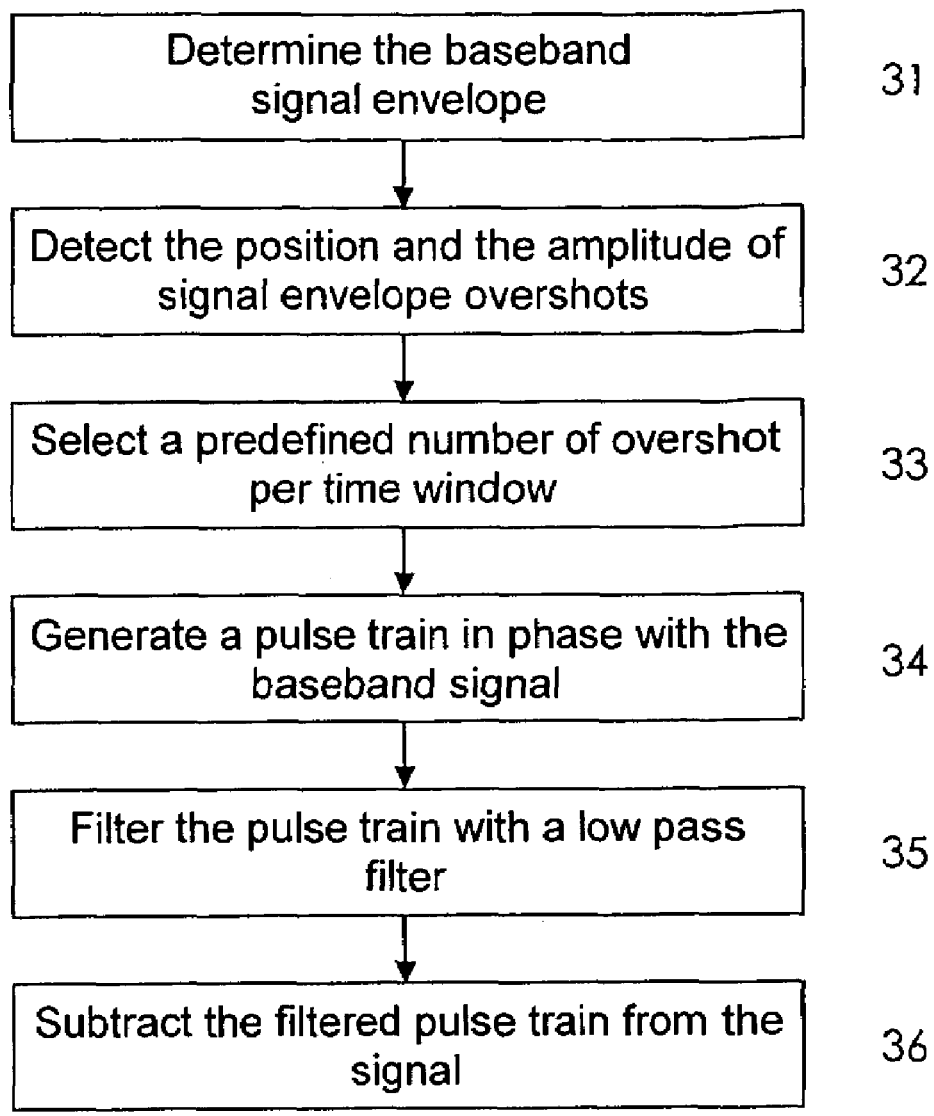
FIG. 3 shows a flow diagram for a possible implementation of the clipping method according to the present invention.

FIG. 3 shows a flow diagram for a possible implementation of the clipping method according to the present invention.

A preferred implementation of the clipping method according to the invention comprises successive steps 31 to 36.

Step 31 comprises determining the baseband signal envelope.

Step 32 comprises detecting the position and the amplitude of signal envelope overshots having an amplitude above a predefined threshold value.

Step 33 comprises selecting a predefined number of overshots per time window.

Step 34 comprises generating a pulse train in phase with the baseband signal by considering only the position, the phase and the amplitude of the overshots.

Step 35 comprises filtering the pulse train with a low pass filter. The central coefficient of the central filter is equal to one so that the amplitude of the filtered pulse train at a location corresponding to an overshot is equal to the difference between the amplitude of the signal overshot and the predefined threshold value.

Step 36 comprises subtracting the filtered pulse train from the signal. Preferably, the signal should be delayed by a delay equal to the processing time required to generate the filtered pulse train in order to keep the signal and the filtered pulse train synchronized.

In a preferred embodiment of the invention, the step 31 to 36 are repeated a predefined number of times.

Figure 4:
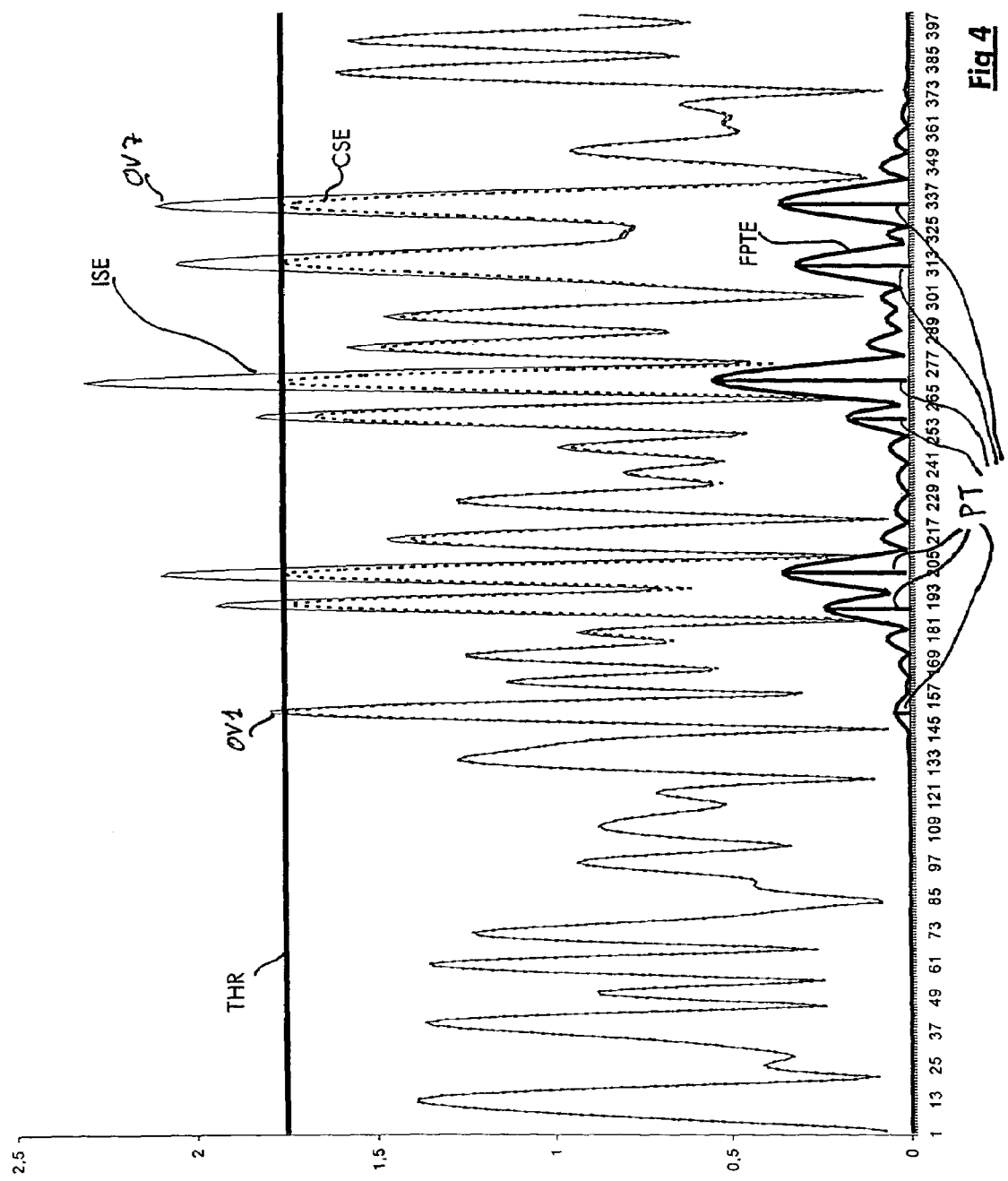
FIG. 4 shows an example of the clipping method according to the present invention applied on a signal.

FIG. 4 shows an example applying the clipping method according to the present invention to a signal.

The x-coordinate of the diagram represents the time and more precisely the sample number of the signal in the time window, and the y-coordinate of the diagram represents the amplitude of the signal envelope.

The input signal envelope ISE, the threshold value THR, the pulse train PT, the filtered pulse train envelope FPTE as well as the clipped signal envelope CSE are represented on the diagram.

The input signal envelope overshots OV1, . . . , OV7 correspond to peaks of the input signal envelope ISE having an amplitude higher than the threshold value TRH.

The pulse train PT is deduced from the input signal envelope ISE in that a pulse is associated to the maximum point of an overshot. All other values of the pulse train are set to zero. The amplitude of a pulse in the pulse train is equal to the difference between the overshot amplitude and the threshold value. Preferably, because of digital processing, the pulse is a Dirac pulse. Other pulse forms may be envisaged in the framework of this invention. The filtered pulse train envelope FPTE is obtained by filtering the pulse train PT with a low pass filter having a central coefficient of one. The clipped signal envelope CSE is obtained by subtracting the filtered pulse train envelope FPTE from the input signal envelope ISE.

Figure 5:
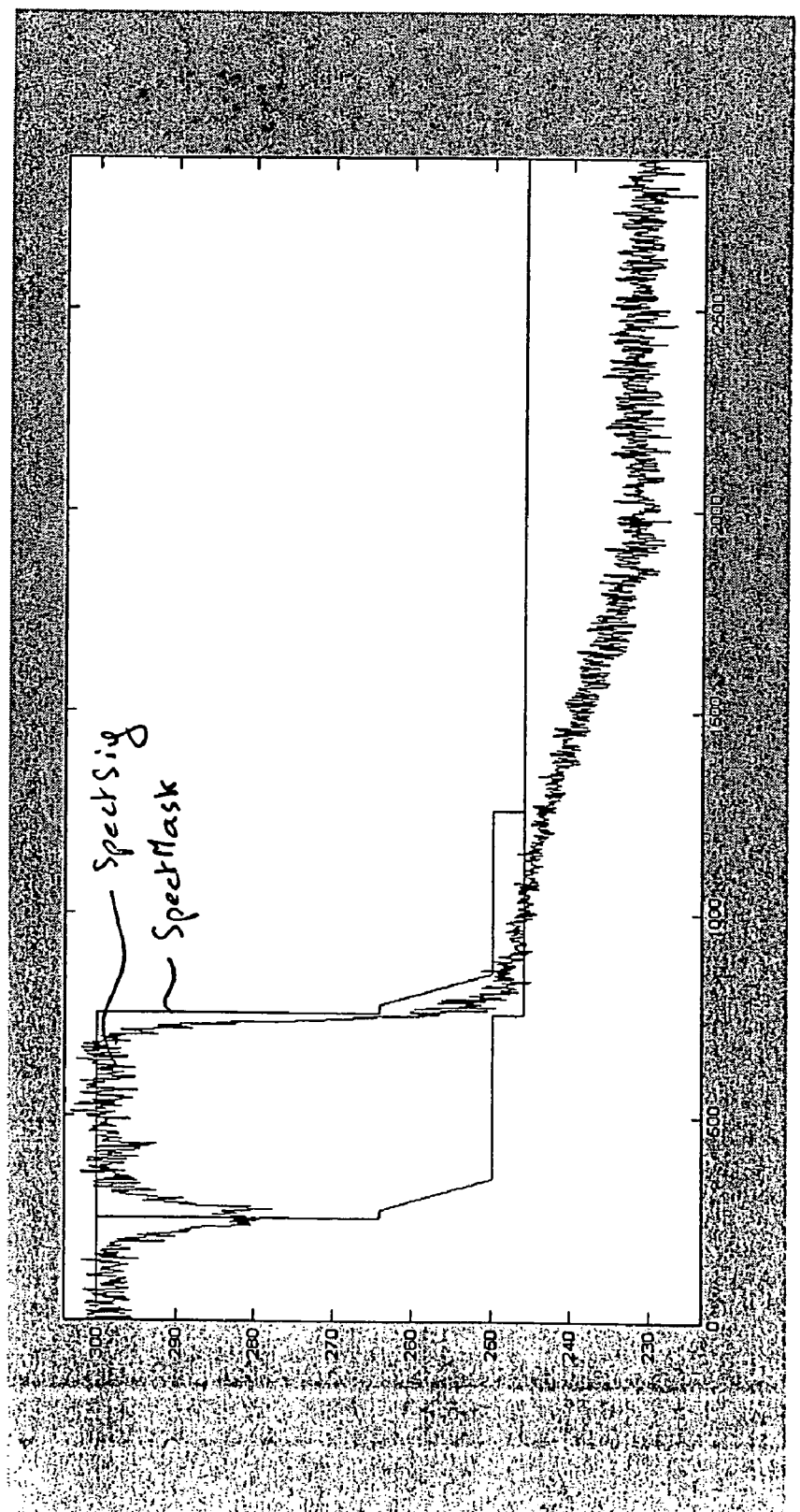
FIG. 5 shows the power spectrum of a multi-carrier signal composed of adjacent carriers clipped according to the present invention.

FIG. 5 shows the power spectrum of a multi-carrier signal composed of adjacent carriers clipped according to the present invention. The signal spectrum, SpectSig, represents the range of frequencies composing the signal (x-coordinate) and the amplitude of these frequencies (y-coordinate). The spectrum mask, SpectMask, represents the requirements, usually set by telecommunications standardization bodies, the signal spectrum should fulfill to be standard compliant.

Thanks to the clipping method according to the present invention, the signal amplitude in the frequency range extending out of the allowed frequency band is lower than the spectrum mask requirements and as a consequence standard compliant. This has the advantage of minimizing adjacent channel interference and as a consequence increasing the capacity of the radio communication system.

The invention claimed is:

1. A method for clipping a wideband signal in order to eliminate signal overshots having an amplitude above a predefined threshold before submitting said wideband signal to a power amplifier, said method comprises:
   subtracting from said wideband signal filtered pulses in phase with said wideband signal, each of said filtered pulses corresponding to one of said overshots, and the amplitude of each of said filtered pulses being dependent on the amplitude of said corresponding overshot and on said predefined threshold; and
   repeating at least two successive iterations of the subtracting step on said wideband signal.

2. The method according to claim 1, the method further comprises:
   selecting a predefined number of signal overshots in a time window having a predefined duration;
   generating a digital pulse train in phase with said signal, the amplitude of each pulse being equal to the difference between said overshot amplitude and said predefined amplitude threshold if said signal amplitude is higher than said predefined threshold;
   filtering said pulse train by a low pass filter; and
   subtracting said filtered pulse train from said wideband signal.

3. The method according to claim 2, wherein the method further comprises oversampling said wideband signal at a predefined oversampling rate, said pulse train being generated at said oversampling rate.

4. The method according to claim 1, wherein the method further comprises hard clipping after said iterations of said substracting step.

5. The method according to claim 1, wherein said wideband signal is a CDMA signal.

6. The method according to claim 1, wherein said wideband signal is a multi-carrier signal comprising a superposition of several CDMA signals on adjacent carriers.

7. The method according to claim 1, wherein at least in the first of said two iterations, the overshots to which each of the generated filtered pulses correspond are less than all of the overshots of said wideband signal above said predefined threshold.

8. The method according to claim 7, wherein, before said subtracting step in said first iteration, said method further comprises:
- detecting overshots in said wideband signal; and
- selecting less than all of said detected overshots for generation of corresponding filtered pulses by said pulse generator.

9. A transmitter for transmitting a wideband signal on a radio interface, said transmitter comprising a signal synthesis module, a clipping module to eliminate signal overshots above a predefined threshold, and a power amplifier, said clipping module comprising:
- a pulse generator for generating filtered pulses in phase with said wideband signal, each of said filtered pulses corresponding to one of said overshots, and the amplitude of each of said filtered pulses being dependent on the amplitude of said corresponding overshot;
- a subtractor for subtracting said filtered pulses from said wideband signal; and
- a loop for repeating at least twice the processing of said wideband signal by said clipping module.

10. The transmitter according to claim 9, wherein said clipping module is implemented on a DSP or a FPGA.

11. The transmitter according to claim 9, wherein the transmitter is used in a base station of a CDMA radio communication network.

12. The transmitter according to claim 9, wherein at least in the first of said two iterations, the overshots to which each of the generated filtered pulses correspond are less than all of the overshots of said wideband signal above said predefined threshold.

13. The transmitter according to claim 12, further comprising:
- an overshot detector which detects overshots in said wideband signal; and
- an overshot selector which selects less than all of the detected overshots for generation of corresponding filtered pulses.

* * * * *